US011503563B2

(12) United States Patent
Ma et al.

(10) Patent No.: US 11,503,563 B2
(45) Date of Patent: Nov. 15, 2022

(54) DISTANCE ESTIMATION USING SIGNALS OF DIFFERENT FREQUENCIES (71) Applicant: Alibaba Group Holding Limited, Grand Cayman (KY)

(72) Inventors: Ssu-Pin Ma, San Jose, CA (US); Hueiming Steve Yang, Milpitas, CA (US)

(73) Assignee: Alibaba Group Holding Limited, George Town (KY)

( * ) Notice: Subject to any disclaimer, the term of this patent is extended or adjusted under 35 U.S.C. 154(b) by 362 days.

(21) Appl. No.: 16/781,762

(22) Filed: Feb. 4, 2020

(65) Prior Publication Data
US 2021/0243716 A1 Aug. 5, 2021

(51) Int. Cl.
H04W 64/00 (2009.01)
H04J 3/06 (2006.01)
H03L 7/07 (2006.01)
H04W 4/029 (2018.01)
H04L 7/033 (2006.01)

(52) U.S. Cl.
CPC ............ H04W 64/003 (2013.01); H03L 7/07 (2013.01); H04J 3/0617 (2013.01); H04J 3/0664 (2013.01); H04J 3/0697 (2013.01); H04L 7/033 (2013.01); H04W 4/029 (2018.02)

(58) Field of Classification Search
None
See application file for complete search history.

(56) References Cited

U.S. PATENT DOCUMENTS

| 7,903,022 | B2 | 3/2011 | Ohara et al. |
| 7,907,083 | B2 | 3/2011 | Sakamoto et al. |
| 7,969,311 | B2 | 6/2011 | Markhovsky et al. |
| 8,072,311 | B2 | 12/2011 | Sadr et al. |
| 8,620,672 | B2 | 12/2013 | Visser et al. |
| 8,811,119 | B2 | 8/2014 | Aarts et al. |
| 8,872,694 | B2 | 10/2014 | Edvardsson et al. |
| 9,128,171 | B2 | 9/2015 | Shirakawa et al. |
| 9,338,665 | B2 | 5/2016 | Zhang et al. |
| 10,469,184 | B1* | 11/2019 | Yu .......................... H04J 3/0682 |
| 2010/0135178 | A1 | 5/2010 | Aggarwal et al. |
| 2017/0026798 | A1 | 1/2017 | Prevatt |
| 2020/0371225 | A1* | 11/2020 | Jin .......................... G01S 11/08 |
| 2021/0239826 | A1* | 8/2021 | Tertinek .................... H04B 1/38 |
| 2022/0095262 | A1* | 3/2022 | Kazaz ....................... G01S 11/08 |

* cited by examiner

Primary Examiner — Basil Ma
(74) Attorney, Agent, or Firm — Lee & Hayes, P.C.

(57) ABSTRACT

A first signal generated from a signal generator may be synchronized with a local clock of a first device at a first time, and sent to a second device, the first signal having a first frequency. A second signal generated from the signal generator may be further synchronized with the local clock of the first device at a second time, the second signal having a second frequency different from the first frequency, and a difference between the second time and the first time being within a predetermined range of a predetermined time difference. The second signal may then be sent to the second device to enable the second device to determine a distance between the first device and the second device based at least in part on a phase difference between the first signal and the second signal.

17 Claims, 3 Drawing Sheets

DISTANCE ESTIMATION USING SIGNALS OF DIFFERENT FREQUENCIES

BACKGROUND

A positioning system involves estimating a location of a device using specialized equipment and sophisticated technologies. An example of the positioning system includes an outdoor positioning system, such as a GPS (Global Positioning System) system, which may be associated with a device and configured to determine a location of the device in conjunction with a satellite system. Depending on the complexity of the GPS system and conditions of the environment around the GPS system, the strength of radio signals received by the GPS system from the satellite system may vary, and thus the accuracy of estimating the location of the device may vary from a range of uncertainty of a fraction of a meter to a range of uncertainty of a few meters. In some circumstances, the GPS system may receive no or poor radio signals from the satellite system, and thus may fail to accurately estimate the location of the device. For example, when the device is located in an indoor environment or located in an environment having quite a number of obstacles (such as airports, parking garages, alleys, and underground locations, etc.), the GPS system may fail to pick up radio signals from the satellite system, and thus may be unable to estimate the location of the device accurately.

In this respect, the positioning system may further include an indoor positioning system, which makes use of a network of devices to locate a device where GPS and other satellite technologies lack precision or fail entirely. Existing indoor positioning systems employ different technologies. In one example, an indoor positioning system may involve measuring distances between a device and nearby anchor nodes (i.e., nodes with fixed and known positions, such as WiFi access points, Bluetooth beacons or ultra-wideband beacons, etc.), and calculating a location of the device based on the strength of signals received from the nearby anchor nodes and a location estimation method (e.g., a trilateration method or a triangulation method), for example. The accuracy of the existing indoor positioning systems relies heavily on the accuracy of a measured distance between each anchor node and a device of which a location is to be determined. However, given the extremely high speed of radio signals (i.e., $3 \times 10^8$ meters per second) and normally a short distance between the device and the anchor node, the time taken for a radio signal to travel between the device and the anchor node is extremely small. This undoubtedly impose a high standard or requirement for a precision of time measurement on the device or time measurement component associated with the device, and requires sophisticated or advanced hardware for such time measurement. A large error or a poor precision in the time measurement will be translated into a large error or a poor precision in measurement of the distance between the device and the anchor device, and lead to a large error or a poor precision in estimating a location of the device. Furthermore, such distance measurement may require installation or presence of specialized hardware such as Bluetooth device for generating or detecting signals that are communicated with the anchor devices.

SUMMARY

This summary introduces simplified concepts of distance estimation, which will be further described below in the Detailed Description. This summary is not intended to identify essential features of the claimed subject matter, nor is it intended for use in limiting the scope of the claimed subject matter.

This disclosure describes example implementations of distance estimation. In implementations, a first signal generated from a signal generator may be synchronized with a local clock of a first device at a first time, and sent to a second device, the first signal having a first frequency. In implementations, a second signal generated from the signal generator may further be synchronized with the local clock of the first device at a second time, the second signal having a second frequency different from the first frequency, and a difference between the second time and the first time being within a predetermined range of a predetermined time difference. In implementations, the second signal may then be sent to the second device to enable the second device to determine a distance between the first device and the second device based at least in part on a phase difference between the first signal and the second signal.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

As noted above, measuring a distance between two devices or objects is a very important operation in positioning methods and systems, and is also a very crucial factor in determining the accuracy of a location of a device that is estimated by a positioning method or system. However, existing methods of measuring a distance between two devices are prone to errors or have poor precision due to the difficulty of measuring the time taken for a signal to travel between the two devices. Furthermore, existing distance measurement methods have a high standard or requirement for a precision in time measurement, and may require sophisticated or advanced hardware for time measurement in order to obtain a good estimate of a distance between two devices.

This disclosure describes an example distance estimation system. The distance estimation system may determine a distance between two devices, e.g., a first device and a second device, based at least in part on a phase difference between two signals of different frequencies that are transmitted between the two devices at the same time or different times. Since measuring a phase difference between two signals transmitted between two devices is less complicated and requires less sophisticated hardware as compared to measuring a time taken for a signal to travel between the two devices, the example distance estimation system can estimate or determine a distance between the two devices more easily. Furthermore, by adaptively selecting signals of a plurality of different frequencies and measuring a respective phase difference between every two of these signals, the example distance estimation system can measure or estimate a distance between two devices in a more accurate and precise manner.

In implementations, functions described herein to be performed by the distance estimation system may be performed by multiple separate units or services. Moreover, although in the examples described herein, the distance estimation system may be implemented as a combination of software and hardware installed in a single device, in other examples, the distance estimation system may be implemented and distributed in multiple devices or as services provided in one or more devices over a network and/or in a cloud computing architecture.

The application describes multiple and varied embodiments and implementations. The following section describes an example framework that is suitable for practicing various implementations. Next, the application describes example systems, devices, and processes for implementing a distance estimation system.

Example Environment

Figure 1:
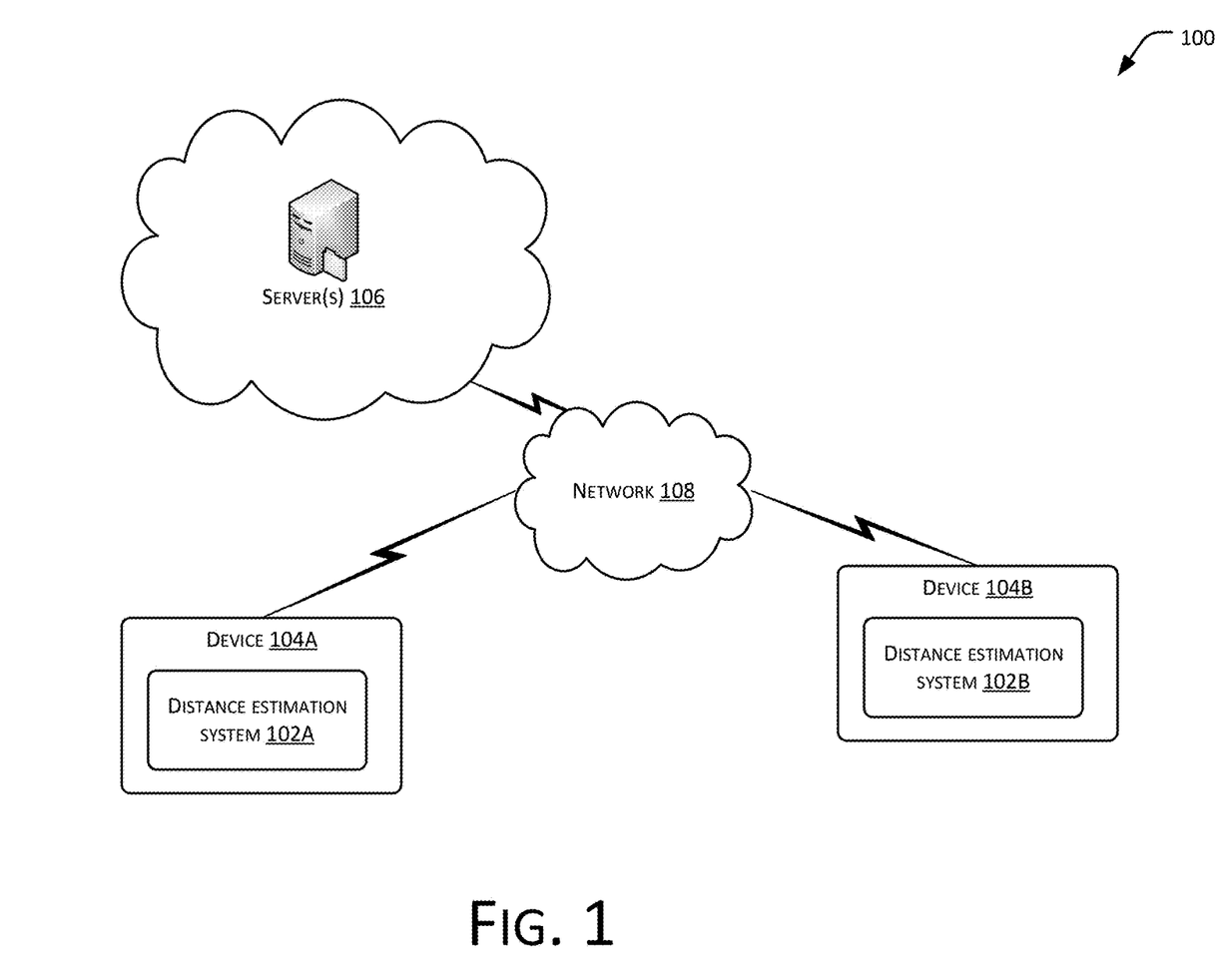
FIG. 1 illustrates an example environment in which a distance estimation system may be used.

FIG. 1 illustrates an example environment 100 usable to implement a distance estimation system. The environment 100 may include distance estimation systems 102A and 102B. In this example, the distance estimation systems 102A and 102B (or collectively referred to as distance estimation systems 102) are described to be included in and/or implemented by devices, such as devices 104A and 104B (or collectively referred to as devices 104) respectively. In some instances, one or more of the distance estimation system 102 may exist as individual entity or device. In other instances, one or more of the distance estimation systems 102 may be included in one or more servers, such as one or more servers 106 in a cloud. For example, some or all of the functions of the one or more of the distance estimation systems 102 may be included in or provided by the device 104A, the device 104B, and/or the one or more servers 106, which are connected and communicated via a network 108.

In implementations, one or more of the devices 104 may be implemented as any of a variety of processor chipsets, which may include, but are not limited to, a system-on-a-chip (SOC) (such as an Internet of things (IoT) SOC, a terminal processor SOC, etc), a system-in-package (SIP), or any other type of integrated circuit (IC) including or being associated with at least processing, storage, and communication functions, etc., that enable the distance estimation system 102 to perform operations for distance estimation as described herein, etc.

In implementations, one or more of the devices 104 may be implemented as any of a variety of consumer or commercial devices, which may include, but are not limited to, a television set, a refrigerator, a camera sensor monitor, a distance sensor, a wearable device, a navigation device, an anchor node, an access point device, etc.

In implementations, one or more of the devices 104 may be implemented as any of a variety of computing devices, which may include, but are not limited to, a desktop computer, a notebook or portable computer, a handheld device, a netbook, an Internet appliance, a tablet or slate computer, a mobile device (e.g., a mobile phone, a personal digital assistant, a smart phone, etc.), a server computer, etc., or a combination thereof.

The network 108 may be a wireless or a wired network, or a combination thereof. The network 108 may be a collection of individual networks interconnected with each other and functioning as a single large network (e.g., the Internet or an intranet). Examples of such individual networks include, but are not limited to, telephone networks, cable networks, Local Area Networks (LANs), Wide Area Networks (WANs), and Metropolitan Area Networks (MANs). Further, the individual networks may be wireless or wired networks, or a combination thereof. Wired networks may include an electrical carrier connection (such a communication cable, etc.) and/or an optical carrier or connection (such as an optical fiber connection, etc.). Wireless networks may include, for example, a WiFi network, other radio frequency networks (e.g., Bluetooth®, Zigbee, etc.), etc.

In implementations, the distance estimation system 102A may initiate a measurement or estimation of a distance between the device 104A and the device 104B, and send a request to the distance estimation system 102B. The distance estimation system 102A and the distance estimation system 102B may then coordinate or reset respective signal generators with corresponding local clocks, and change and communicate signals of different frequencies at predetermined one or more time intervals. The distance estimation system 102A or the distance estimation system 102B may then measure or estimate the distance between the device 104A and the device 104B based on phase difference(s) between the signals of different frequencies.

Example Distance Estimation System

Figure 2:
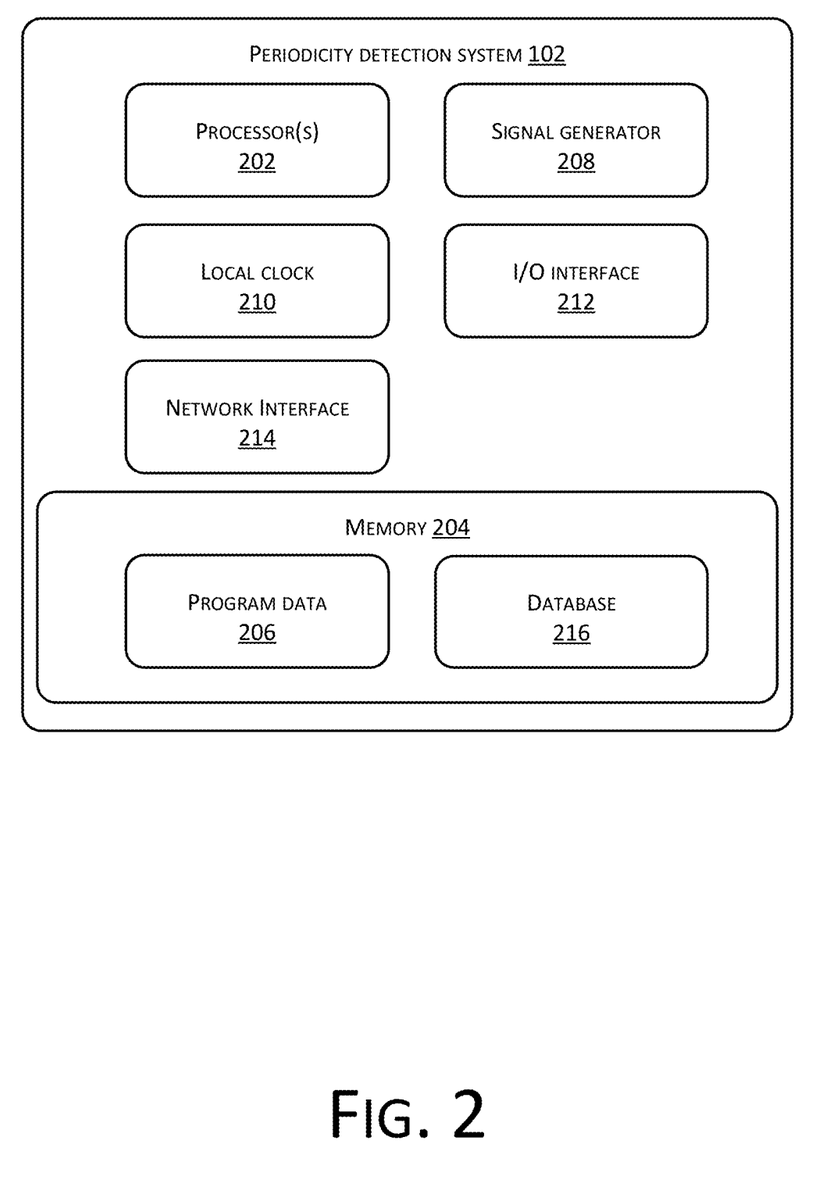
FIG. 2 illustrates the example distance estimation system in more detail.

FIG. 2 illustrates the distance estimation system 102 in more detail. In implementations, the distance estimation system 102 may be included in and/or implemented by a device such as the device 104A or the device 104B. As described in the foregoing description, the device may be a processor chipset, a consumer device, or a computing device, etc. In implementations, the distance estimation system 102 may include, but is not limited to, one or more processors 202, memory 204, and program data 206. In implementations, the distance estimation system 102 may further include a signal generator 208, and a local clock 210. The signal generator 208 may include, but is not limited to, a phase lock loop (PLL) oscillator, a fractional-N PPL oscillator, etc. Additionally, in some implementations, the distance estimation system 102 may further include an input/output (I/O) interface 212, and/or a network interface 214. In implementations, some of the functions of the distance estimation system 102 may be implemented using hardware, for example, an ASIC (i.e., Application-Specific Integrated Circuit), a FPGA (i.e., Field-Programmable Gate Array), and/or other hardware. In this example, the distance estimation system 102 may be included in a device such as the device 104. In some instances, the distance estimation system 102 may exist as a separate entity peripheral to or associated with a device such as the device 104.

In implementations, the processors 202 may be configured to execute instructions that are stored in the memory 204, and/or received from the input/output interface 208, and/or the network interface 210. In implementations, the processors 202 may be implemented as one or more hardware processors including, for example, a microprocessor, an application-specific instruction-set processor, a physics processing unit (PPU), a central processing unit (CPU), a graphics processing unit, a digital signal processor, a tensor processing unit, etc. Additionally or alternatively, the functionality described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), system-in-package systems (SIPs), complex programmable logic devices (CPLDs), etc.

The memory 204 may include processor readable media in a form of volatile memory, such as Random Access Memory (RAM) and/or non-volatile memory, such as read only memory (ROM) or flash RAM. The memory 204 is an example of processor readable media.

The processor readable media may include a volatile or non-volatile type, a removable or non-removable media, which may achieve storage of information using any method or technology. The information may include a processor readable instruction, a data structure, a program module or other data. Examples of processor readable media include, but not limited to, phase-change memory (PRAM), static random access memory (SRAM), dynamic random access memory (DRAM), other types of random-access memory (RAM), read-only memory (ROM), electronically erasable programmable read-only memory (EEPROM), quick flash memory or other internal storage technology, compact disk read-only memory (CD-ROM), digital versatile disc (DVD) or other optical storage, magnetic cassette tape, magnetic disk storage or other magnetic storage devices, or any other non-transmission media, which may be used to store information that may be accessed by a device. As defined herein, the processor readable media does not include any transitory media, such as modulated data signals and carrier waves.

Although in this example, only hardware components are described in the distance estimation system 102, in other instances, the distance estimation system 102 may further include other hardware components and/or other software components such as program units to execute instructions stored in the memory 204 for performing various operations. For example, the distance estimation system 102 may further include a database 216 storing distance data.

Example Methods

Figure 3:
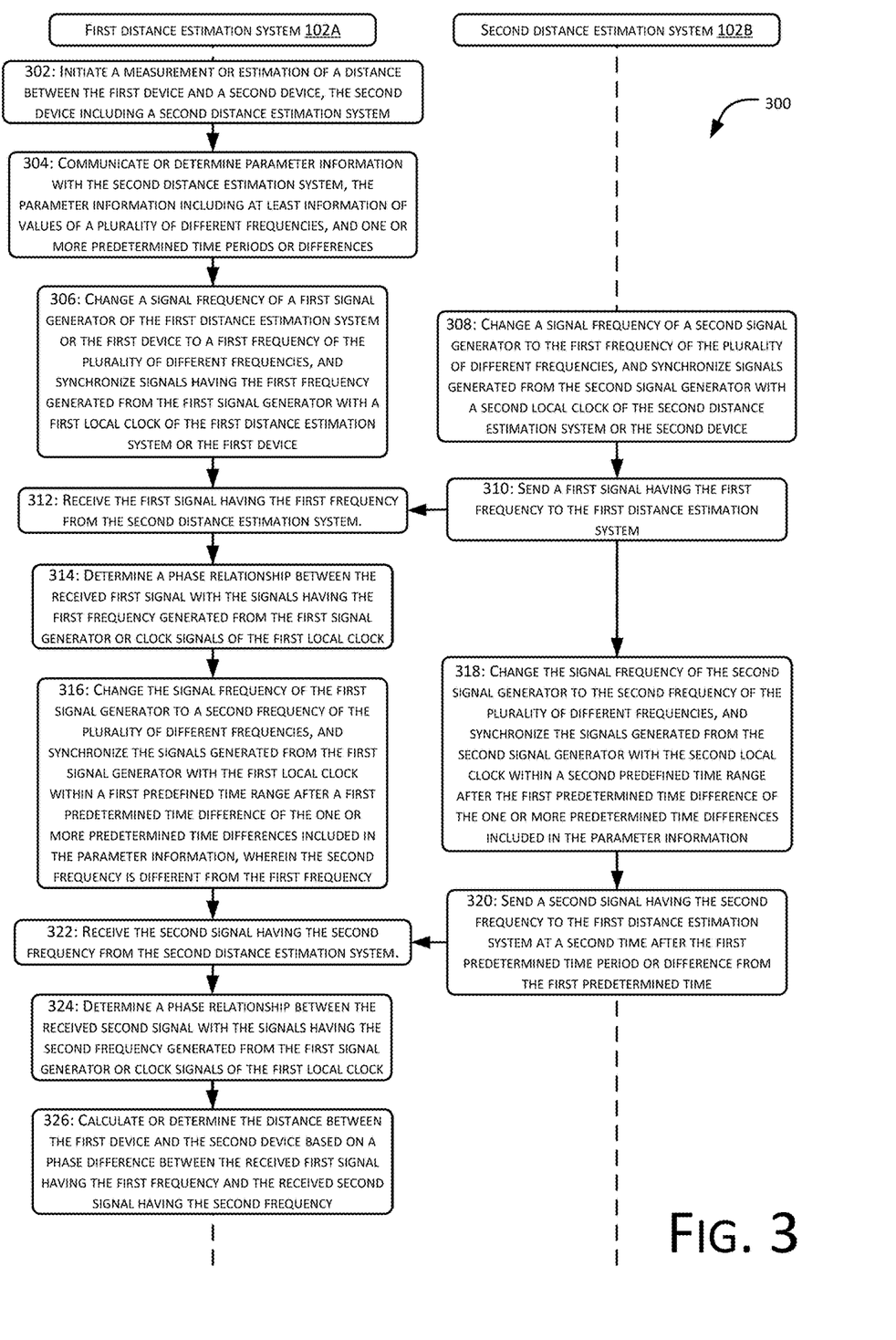
FIG. 3 illustrates an example method of distance estimation.

FIG. 3 shows a schematic diagram depicting an example method of periodicity detection. The method of FIG. 3 may, but need not, be implemented in the environment of FIG. 1 and using the system of FIG. 2. For ease of explanation, a method 300 is described with reference to FIGS. 1 and 2. However, the method 300 may alternatively be implemented in other environments and/or using other systems.

The method 300 is described in the general context of computer-executable instructions. Generally, computer-executable instructions can include routines, programs, objects, components, data structures, procedures, modules, functions, and the like that perform particular functions or implement particular abstract data types. Furthermore, each of the example methods are illustrated as a collection of blocks in a logical flow graph representing a sequence of operations that can be implemented in hardware, software, firmware, or a combination thereof. The order in which the method is described is not intended to be construed as a limitation, and any number of the described method blocks can be combined in any order to implement the method, or alternate methods. Additionally, individual blocks may be omitted from the method without departing from the spirit and scope of the subject matter described herein. In the context of software, the blocks represent computer instructions that, when executed by one or more processors, perform the recited operations. In the context of hardware, some or all of the blocks may represent application specific integrated circuits (ASICs) or other physical components that perform the recited operations.

Referring back to FIG. 3, at block 302, a first distance estimation system of a first device may initiate a measurement or estimation of a distance between the first device and a second device, the second device including a second distance estimation system.

In implementations, the first device may receive a request (e.g., from a user through a positioning application or service provided by the first device) for determining a location of the first device. Additionally or alternatively, the first device may be configured, for example, by the positioning application or service, to determine the location of the first device on a regular basis, at a particular time, or during a predetermined time period.

In implementations, the first device may invoke the first distance estimation system to determine the location of the first device. In implementations, the first device may invoke the first distance estimation system when a GPS system is unavailable or the strength of a GPS signal received by the GPS system is poor. Additionally or alternatively, the first device may invoke the first distance estimation system when the first device detects the presence of anchor nodes that can be used for determining the location of the first device. For example, the first device may receive broadcasting signals from the anchor nodes, indicating the presence of these anchor nodes. In implementations, the first distance estimation system may determine or estimate respective distances between the first device and the anchor nodes (e.g., the second device), and estimate the location of the first device based on the determined distances using a predetermined location estimation method such as a triangulation method. In implementations, the first distance estimation system and the second estimation system (or the first device and the second device) may further establish a communication connection or channel for subsequent data or signal communications.

For the sake of description and without loss of generality, the first distance estimation system and the first device may be the distance estimation system 102A and the device 104A respectively, while the second distance estimation system and the second device may be the distance estimation system 102B and the device 104B respectively. In implementations, the first distance estimation system or the first device may act as a receiving entity or device that receives signals from the second distance estimation system or the second device that act as a sending entity or device that generates and sends the signals to the first distance estimation system or the first device.

At block 304, the first distance estimation system may communicate or determine parameter information with the second distance estimation system, the parameter information including at least information of values of a plurality of different frequencies, and one or more predetermined time periods or differences.

In implementations, the first distance estimation system may communicate parameter information using for determining the distance between the first device and the second device with the second estimation system. Depending on whether the first device or the second device (e.g., the anchor node) has default settings for parameters used for determining a distance, the parameter information may be sent received by the first distance estimation system or the second distance system respectively. In implementations, the parameter information may include, but is not limited to, values of a first frequency and a second frequency, and a predetermined time period or difference, with the first frequency being different from the second frequency. In implementations, the parameter information may further include a first predetermined time or a first predetermined time interval that indicates a time at which the first distance estimation system and the second distance estimation system start to communicate a signal used for determining the distance between the first device and the second device.

In implementations, the parameter information may include, but is not limited to, values of a plurality of different frequency sets, and one or more predetermined time periods or differences, each frequency set including two different frequencies, and a frequency difference between two frequencies in one frequency set being different from frequency difference(s) in other frequency set(s) of the plurality of different frequency sets. For example, the first distance estimation system may estimate or determine the distance between the first device and the second device for a number of times, each time using a different frequency set and a respective predetermined time period or difference. In implementations, the one or more predetermined time periods or differences may be the same or different.

At block 306, the first distance estimation system may change a signal frequency of a first signal generator of the first distance estimation system or the first device to a first frequency of the plurality of different frequencies, and synchronize signals having the first frequency generated from the first signal generator with a first local clock of the first distance estimation system or the first device.

At block 308, the second distance estimation system may change a signal frequency of a second signal generator to the first frequency of the plurality of different frequencies, and synchronize signals generated from the second signal generator with a second local clock of the second distance estimation system or the second device.

In implementations, after agreeing upon the parameter information for determining the distance between the first device and the second device, the first distance estimation system and the second distance estimation system may change signal frequencies of respective local signal generators (e.g., respective signal generators 208) to a first frequency of the plurality of different frequencies included in the parameter information, and synchronize signals of the first frequency generated from the respective local signal generators with respective local clocks (e.g., respective local clocks 210) at a predetermined time (e.g., the first predetermined time) or after a predetermined time interval (e.g., the first predetermined time interval) that may be included in the parameter information. In implementations, the first distance estimation system and the second distance estimation system may synchronize the signals of the first frequency generated from the respective local signal generators with the respective local clocks by resetting the respective local signal generators. In implementations, signals generated by a signal generator may include electromagnetic signals, such as radio signals, By way of example and not limitation, a local signal generator may be a fractional-N PLL oscillator, and a reset may be performed on the local signal generator by resetting a signal-delta modulator (or data in registers of the signal-delta modulator) in the local signal generator (i.e., the fractional-N PLL oscillator) to enable an output of the signal-delta modulator to restart from a known starting point. This enables signals generated from the local signal generator to establish a known phase relationship with a local clock (or clock signals of the local clock) at a time point when the local signal generator is reset, i.e., locking an edge of a signal generated from the local signal generator with an edge of clock signals of the local clock.

In implementations, a new reset circuit may be added to the local signal generator if the local signal generator does not include any reset circuit to synchronize signals generated from the local signal generator and the local clock. Since a local clock of a device (e.g., the first device or the second device) produces clock signals continuously while the device is powered on, the local clock can be used as a reference for comparing a phase difference between two signals of different frequencies generated or received at different times.

At block 310, the second distance estimation system may send a first signal having the first frequency to the first distance estimation system.

In implementations, the second distance estimation system may send the first signal having the first frequency to the first distance estimation system through the established communication connection or channel within a certain time range after the second distance estimation system synchronizes the second signal generator with the second local clock (e.g., immediately after the second distance estimation system resets the second signal generator).

At block 312, the first distance estimation system may receive the first signal having the first frequency from the second distance estimation system.

In implementations, the first distance estimation system may receive the first signal having the first frequency from the second distance estimation system through the established communication connection or channel.

At block 314, the first distance estimation system may determine a phase relationship between the received first signal with the signals having the first frequency generated from the first signal generator or clock signals of the first local clock.

In implementations, after receiving the first signal from the second distance estimation system, the first distance estimation system may determine or calculate a phase relationship or phase difference between the received first signal and the signals (i.e., the signals having the first frequency) generated from the first signal generator. Since the signals generated from the first signal generator has a known phase relationship with clock signals generated from the first local clock, the first distance estimation system may determine or calculate a phase relationship or phase difference between the received first signal and clock signals generated from the first local clock based on the phase relationship or phase difference between the received first signal and the signals generated from the first signal generator.

In implementations, the first distance estimation system may calculate the phase relationship or phase difference between the received first signal and the signals generated from the first signal generator using any conventional method for calculating a phase difference between signals of a same frequency. In implementations, the first distance estimation system may record the phase relationship or phase difference between the received first signal and the signals generated from the first signal generator, or the phase relationship or phase difference between the received first signal and the clock signals of the first local clock in the memory (e.g., the memory 204 or the database 216) of the first distance estimation system.

At block 316, the first distance estimation system may change the signal frequency of the first signal generator to a second frequency of the plurality of different frequencies, and synchronize the signals generated from the first signal generator with the first local clock within a first predefined time range after a first predetermined time difference of the one or more predetermined time differences included in the parameter information, wherein the second frequency is different from the first frequency.

In implementations, within a first predefined time range after a first predetermined time period or difference since the time when the first distance estimation system synchronizes the signals of the first frequency generated from the first signal generator with the local clock (e.g., the first predetermined time when a reset is performed on the signal generator), the first distance estimation system may change the signal frequency of the signal generator to a second frequency of the plurality of different frequencies described in the parameter information, and synchronize signals having the second frequency generated from the first signal generator with the first local clock.

In implementations, the first distance estimation system may change the signal frequency of the second signal generator to the second frequency at any time after the phase relationship between the received first signal with the signals generated from the first signal generator is determined or the first signal having the first frequency is received, and before the predetermined time period or difference. The first distance estimation system may then synchronize signals having the second frequency generated from the first signal generator with the first local clock within the first predefined time range after the predetermined time period or difference since the time when the first distance estimation system synchronizes the signals of the first frequency generated from the first signal generator with the second local clock (e.g., the first predetermined time when a reset is performed on the second signal generator).

By way of example and not limitation, if a signal generator (i.e., the first signal generator) is a fractional-N PLL oscillator, a first predefined time range may be, for example, an integral multiple of a specific time parameter, wherein a value of the integral multiple may be one, two, five, ten, etc. In implementations, the specific time parameter may depend on a frequency of a local clock (in this case, the first local clock) associated with the signal generator and/or a signal frequency of the signal generator. In implementations, the specific time parameter may be defined as a reciprocal of a product of a fractional value and the frequency of the local clock, wherein the fractional value of the dividing is a fractional value that is obtained after dividing the signal frequency of signal generator by the frequency of the local clock. For example, if the frequency of the local clock is 32 MHz and the signal frequency of the signal generator is 2470 MHz, the fractional value is $3/16$ after $2470/32=77+3/16$. In this case, the specific time parameter is calculated as $1/(3/16 \times 32) = 1/6$ μs.

At block 318, the second distance estimation system may change the signal frequency of the second signal generator to the second frequency of the plurality of different frequencies, and synchronize the signals generated from the second signal generator with the second local clock within a second predefined time range after the first predetermined time difference of the one or more predetermined time differences included in the parameter information.

In implementations, the second distance estimation system may change the signal frequency of the first signal generator to the second frequency at any time after the first signal having the first frequency is sent, and before the first predetermined time period or difference included in the parameter information. The second distance estimation system may then synchronize signals having the second frequency generated from the second signal generator with the second local clock within the second predefined time range after the first predetermined time period or difference since the time when the second distance estimation system synchronizes the signals of the second frequency generated from the second signal generator with the second local clock (e.g., the first predetermined time when a reset is performed on the second signal generator).

In implementations, if a signal generator (i.e., the second signal generator) is a fractional-N PLL oscillator, a second predefined time range may be, for example, an integral multiple of a specific time parameter, wherein a value of the integral multiple may be one, two, five, ten, etc. In implementations, the specific time parameter may depend on a frequency of a local clock (in this case, the second local clock) associated with the signal generator and/or a signal frequency of the signal generator. In implementations, the specific time parameter may be defined as a reciprocal of a product of a fractional value and the frequency of the local clock, wherein the fractional value of the dividing is a fractional value that is obtained after dividing the signal frequency of signal generator by the frequency of the local clock as described in the foregoing description.

At block 320, the second distance estimation system may send a second signal having the second frequency to the first distance estimation system at a second time after the first predetermined time period or difference from the first predetermined time.

In implementations, the second distance estimation system may send the second signal having the second frequency to the first distance estimation system through the established communication connection or channel immediately after the second distance estimation system synchronizes the second signal generator with the second local clock (e.g., immediately after the second distance estimation system resets the second signal generator).

In implementations, after changing the signal frequency of the second signal generator to the second frequency and synchronizing the signals generated from the second signal generator with the second local clock (e.g., by resetting the second signal generator to enable the signals having the second frequency generated from the second signal generator to establish a known phase relationship with the second local clock), the second distance estimation system may send a second signal having the second frequency to the first distance estimation system after the first predetermined time period or difference since the time when the second distance estimation system may send the first signal having the first frequency to the first distance estimation system. In implementations, the second distance estimation system may send the second signal having the second frequency to the first distance estimation system through the established communication connection or channel.

At block 322, the first distance estimation system may receive the second signal having the second frequency from the second distance estimation system.

In implementations, the first distance estimation system may receive the second signal having the second frequency from the second distance estimation system through the established communication connection or channel.

At block 324, the first distance estimation system may determine a phase relationship between the received second signal with the signals having the second frequency generated from the first signal generator or the clock signals of the first local clock.

In implementations, after receiving the second signal from the second distance estimation system, the first distance estimation system may determine or calculate a phase relationship or phase difference between the received second signal and the signals (i.e., the signals having the second frequency) generated from the first signal generator. Since the signals generated from the first signal generator has a known phase relationship with the clock signals generated from the first local clock, the first distance estimation system may determine or calculate a phase relationship or phase difference between the received second signal and the clock signals generated from the first local clock based on the phase relationship or phase difference between the received second signal and the signals generated from the first signal generator.

In implementations, the first distance estimation system may calculate the phase relationship or phase difference between the received second signal and the signals generated from the first signal generator using any conventional method for calculating a phase difference between signals of a same frequency. In implementations, the first distance estimation system may record the phase relationship or phase difference between the received second signal and the signals generated from the first signal generator, or the phase relationship or phase difference between the received second signal and the clock signals generated from the first local clock in the memory (e.g., the memory 204 or the database 216) of the first distance estimation system.

At block 326, the first distance estimation system may calculate or determine the distance between the first device and the second device based on a phase difference between the received first signal having the first frequency and the received second signal having the second frequency.

In implementations, after receiving both the first signal having the first frequency and the second signal having the second frequency that are separated by the first predetermined time period or difference, the first distance estimation system may calculate or determine the distance between the first device and the second device based on a phase difference between the received first signal having the first frequency and the received second signal having the second frequency. Since the first distance estimation system has calculated respective phase differences or phase relationships of the first signal and the second signal with respect to a common reference (i.e., the clock signals of the first local clock), the first distance estimation system may obtain the phase difference between the first signal and the second signal based on these phase differences or phase relationships of the first signal and the second signal with respect to the clock signals of the first local clock. For example, the first distance estimation system may obtain the phase difference between the first signal and the second signal by subtracting the phase difference or phase relationship between the first signal and the clock signals of the first local clock from the phase difference or phase relationship between the second signal and the clock signals of the first local clock, or vice versa.

In implementations, the first distance estimation system may calculate or determine a value of the distance between the first device and the second device based on Equation (1) as follows:

$$D_1 = \Delta\phi \times \frac{c}{2\pi(f_2 - f_1)} + \frac{cN_1}{2\pi(f_2 - f_1)} \quad (1)$$

where $D_1$ is a first estimated value for the distance between the first device and the second device,
c is the speed of light,
$f_1$ is the first frequency,
$f_2$ is the second frequency, with the second frequency being assumed to be larger than the first frequency, $$\Delta\phi = \begin{cases} \phi_2 - \phi_1 & \phi_2 - \phi_1 \geq 0 \\ \phi_2 - \phi_1 + 2\pi & \phi_2 - \phi_1 < 0 \end{cases},$$

$\phi_1$ is the phase relationship or phase difference between the first signal and the clock signals of the first local clock,
$\phi_2$ is the phase relationship or phase difference between the second signal and the clock signals of the first local clock, and
$N_1$ is an integer greater than or equal to zero.

In implementations, if the distance between the first device and the second device is within a distance range of $$\frac{c}{2\pi(f_2 - f_1)},$$

$N_1$ is equal to zero. In implementations, as can be seen from Equation (1), the smaller the frequency difference between the two frequencies (e.g., $f_2-f_1$) is, the larger the distance range will be.

In implementations, if the number of the plurality of different frequencies is more than two, a new set of two different frequencies, e.g., the first frequency and a third frequency, or a third frequency and a fourth frequency, may be obtained or selected from the plurality of different frequencies, and the first distance estimation system and the second distance estimation system may repeat corresponding operations as described at blocks 306-326 using this new set of two different frequencies to determine or calculate a new value (i.e., a second estimated value) for the distance between the first device and the second device. For example, if the new set of two different frequencies corresponds to a third frequency and a fourth frequency, the second estimated value of the distance between the first device and the second device is calculated as follows:

$$D_2 = \Delta\phi \times \frac{c}{2\pi(f_4 - f_3)} + \frac{cN_2}{2\pi(f_4 - f_3)} \quad (2)$$

with an assumption that the fourth frequency ($f_4$) being larger than the third frequency ($f_3$).

Since both the first estimated value and the second estimated value are estimated values for the same distance, i.e., the distance between the first device and the second device, these two values (i.e., $D_1$ and $D_2$) need to be the same. Accordingly, by solving both Equations (1) and (2) with a constraint of $D_1$ being substantially equal to $D_2$, $N_1$ and $N_2$ can be found, and a more accurate value for the distance between the first device and the second device can be obtained or calculated by taking an average of $D_1$ and $D_2$.

In implementations, an even more accurate value for the distance between the first device and the second device may be obtained by repeating corresponding operations as described at blocks 306-326 using one or more new sets of two different frequencies (e.g., a fifth frequency and a sixth frequency, the second frequency and the third frequency, the first frequency and the fourth frequency, etc.) to obtain one or more newly estimated values for the distance between the first device and the second device using equations similar to Equations (1) and (2). Similar to those discussed above, by solving the equations with a constraint that the first estimated value, the second estimated value, and the one or more newly estimated values are substantially equal with each other, a more accurate value for the distance between the first device and the second device can be obtained or calculated by taking an average of all these estimated values.

In implementations, a relative local clock frequency difference or a clock frequency offset may exist between the first local clock of the first distance estimation system (or the first device) and the second local clock of the second distance estimation system (or the second device). This relative local clock frequency difference or clock frequency offset may introduce an error in the calculation of the distance between the first device and the second device. For example, if the clock frequency offset is 10 ppm, and the predetermined time difference included or described in the parameter information is 625 µs, a distance error is approximated as 10 ppm×625 µs×3×10$^8$=1.875 m.

In implementations, the first distance estimation system may measure this clock frequency offset by determining an actual time difference between the time when the first signal of the first frequency is received and the time when the second signal of the second frequency, and comparing this actual time difference with the predetermined time difference (e.g., the first predetermined time difference) included or described in the parameter information. The first distance estimation system may treat a comparison result (i.e., a difference between the actual time difference and the predetermined time difference) as the clock frequency offset, and may then calculate the error due to this clock frequency offset to correct the estimated value for the distance between the first device and the second device that is obtained in the foregoing description.

In implementations, signals such as the first signal and the second signal that are transmitted or communicated between the first device and the second device (or between the first distance estimation system and the second distance estimation system) may be modulated using FSK (frequency-shift keying), PSK (phase-shift keying), GFSK (Gaussian frequency-shift keying), GMSK (Gaussian minimum-shift keying), or other modulation methods. In this case, a phase of a signal (e.g., the first signal and the second signal) that is received may be affected by such modulation. For example, "one" signal and "zero" signal of an FSK have different frequencies, and may impact the phase of the received signal that is measured.

In implementations, a predetermined sequence of "one" signals and "zero" signals may be transmitted between the first device and the second device, and a phase value of this sequence of "one" signals and "zero" signals may be calculated to remove the impact of the modulated signal. In this case, a phase of a carrier frequency of the modulated signal may be obtained by taking an average of respective values of phases of the signals (i.e., the "one" signals and the "zero" signals) in the sequence. Alternatively, a modulated signal (such as a modulated first signal or a modulated second signal) may be demodulated after being received by the receiving entity or device (such as the first device or the first distance estimation system) to remove the impact of a corresponding modulation on the phase of the received signal, and corresponding operations as described in the above blocks may be performed accordingly.

Additionally or alternatively, this clock frequency offset between the first local clock of the first distance estimation system (or the first device) and the second local clock of the second distance estimation system (or the second device) may be removed by interchanging the roles of the first distance estimation system and the second distance estimation system. In other words, the first distance estimation system may act as the sending entity or device, while the second distance estimation system mat act as the receiving entity or device, and the above process (i.e., blocks 306-326) is performed to obtain a second estimated value for the distance between the first device and the second device. The clock frequency offset may be removed by using an average value of the first estimated value and the second estimated value as a better estimate of the distance between the first device and the second device.

In implementations, a ratio between the predetermined time difference (e.g., the first predetermined time difference) and the specific time parameter may be integral, and a new clock signal having a period that is equal to an integral multiple of the specific time parameter may be created. In this case, synchronizing signals (e.g., the signals of the first frequency or the signals of the second frequency) generated from a signal generator (e.g., the first signal generator or the second signal generator) with clock signals of a local clock (e.g., the first local clock or the second local clock) may be performed by resetting the signal generator at the time when an edge of the new clock signal is reached, thus enabling that a time separation of two resets or synchronizations (i.e., a first reset or synchronization of signals of a first frequency generated from a signal generator with clock signals of a local clock and a second reset or synchronization of signals of a second frequency generated from the signal generator with the clock signals of the local clock) falls within a predefined time range of a predetermined time difference (e.g., the first predetermined time difference) as described in the foregoing description.

In implementations, the first distance estimation system or the first device may repeat the above process (i.e., blocks 302-326) with anchor nodes or devices other than the second device to calculate or determine respective distances from these other anchor nodes or devices. The first device (or the first distance estimation system) may determine the location of the first device based on at least three calculated distances from the anchor nodes or devices and known locations of the anchor nodes.

Although the above method blocks are described to be executed in a particular order, in some implementations, some or all of the method blocks can be executed in other orders, or in parallel.

Conclusion

Although implementations have been described in language specific to structural features and/or methodological acts, it is to be understood that the claims are not necessarily limited to the specific features or acts described. Rather, the specific features and acts are disclosed as exemplary forms of implementing the claimed subject matter. Additionally or alternatively, some or all of the operations may be implemented by one or more ASICS, FPGAs, or other hardware.

The present disclosure can be further understood using the following clauses.

Clause 1: A method implemented by a first device, the method comprising: synchronizing a first signal generated from a signal generator with a local clock of the first device at a first time, the first signal having a first frequency; sending the first signal to a second device; synchronizing a second signal generated from the signal generator with the local clock of the first device at a second time, the second signal having a second frequency different from the first frequency, and a difference between the second time and the first time being within a predetermined range of a predetermined time difference; and sending the second signal to the second device to enable the second device to obtain a first estimated value for a distance between the first device and the second device based at least in part on a phase difference between the first signal and the second signal.

Clause 2: The method of Clause 1, further comprising sending information of the first frequency, the second frequency and the predetermined time difference to the second device.

Clause 3: The method of Clause 1, wherein the signal generator comprises a fractional-N phase lock loop with a resetting circuit.

Clause 4: The method of Clause 3, wherein synchronizing the first signal generated from the signal generator with the local clock of the first device at the first time comprises performing a reset on the fractional-N phase lock loop through the resetting circuit at the first time.

Clause 5: The method of Clause 1, wherein synchronizing the first signal generated from the signal generator with the local clock of the first device comprises establishing a phase relationship between a phase of the first signal and the local clock.

Clause 6: The method of Clause 1, further comprising: synchronizing a third signal generated from the signal generator with the local clock of the first device at a third time, the third signal having a third frequency different from the first frequency and the second frequency, and a difference between the second time and the third time being within the predetermined range of the predetermined time difference; and sending the third signal to the second device to enable the second device to obtain a second estimated value for the distance between the first device and the second device based at least in part on a phase difference between the second signal and the third signal.

Clause 7: The method of Clause 6, further comprising obtaining a final estimated value for the distance between the first device and the second device based on the first estimated value and the second estimated value.

Clause 8: One or more processor readable media storing executable instructions that, when executed by one or more processors of a first device, cause the one or more processors to perform acts comprising: changing a signal frequency of a signal generator to a first frequency; synchronizing signals generated from the signal generator with a local clock of the first device at a first time; receiving a first signal from a second device; changing the signal frequency of the signal generator to a second frequency; synchronizing the signals generated from the signal generator with the local clock of the first device at a second time, a difference between the second time and the first time being within a predetermined range of a predetermined time difference; receiving a second signal from the second device; and obtaining a first estimated value for a distance between the first device and the second device based at least in part on a phase difference between the first signal and the second signal.

Clause 9: The one or more processor readable media of Clause 8, the acts further comprising receiving information of the first frequency, the second frequency and the predetermined time difference from the second device.

Clause 10: The one or more processor readable media of Clause 8, wherein the signal generator comprises a fractional-N phase lock loop with a resetting circuit.

Clause 11: The one or more processor readable media of Clause 10, wherein synchronizing the signals generated from the signal generator with the local clock of the first device at the first time comprises performing a reset on the fractional-N phase lock loop through the resetting circuit at the first time.

Clause 12: The one or more processor readable media of Clause 8, the acts further comprising calculating the predetermined range based at least in part on a frequency of the local clock and a fractional value.

Clause 13: The one or more processor readable media of Clause 8, wherein synchronizing the signals generated from the signal generator with the local clock of the first device comprises establishing a phase relationship between a phase of the signals and the local clock.

Clause 14: The one or more processor readable media of Clause 8, the acts further comprising: calculating a clock frequency offset between the local clock of the first device and a local clock of the second device; and correcting the calculated distance based at least in part on the calculated clock frequency offset.

Clause 15: The one or more processor readable media of Clause 8, the acts further comprising: changing the signal frequency of the signal generator to a third frequency, the third frequency being different from the first frequency and the second frequency; synchronizing the signals generated from the signal generator with the local clock of the first device at a third time, a difference between the second time and the third time being within the predetermined range of the predetermined time difference; receiving a third signal from the second device; and obtaining a second estimated value for the distance between the first device and the second device based at least in part on a phase difference between the second signal and the third signal.

Clause 16: A system implemented by a first processor chipset, the system comprising: one or more processors; and memory storing executable instructions that, when executed by the one or more processors, cause the one or more processors to perform acts comprising: changing a signal frequency of a signal generator to a first frequency; synchronizing signals generated from the signal generator with a local clock of the first processor chipset at a first time; receiving a first signal from a second processor chipset; changing the signal frequency of the signal generator to a second frequency; synchronizing the signals generated from the signal generator with the local clock of the first processor chipset at a second time, a difference between the second time and the first time being within a predetermined range of a predetermined time difference; receiving a second signal from the second processor chipset; and calculating a distance between the first processor chipset and the second processor chipset based at least in part on a phase difference between the first signal and the second signal.

Clause 17: The system of Clause 15, the acts further comprising receiving information of the first frequency, the second frequency and the predetermined time difference from the second processor chipset.

Clause 18: The system of Clause 15, wherein the signal generator comprises a fractional-N phase lock loop with a resetting circuit.

Clause 19: The system of Clause 17, wherein synchronizing the signals generated from the signal generator with the local clock of the first processor chipset at the first time comprises performing a reset on the fractional-N phase lock loop through the resetting circuit at the first time.

Clause 20: The system of Clause 15, the acts further comprising: calculating a clock frequency offset between the local clock of the first processor chipset and a local clock of the second processor chipset; and correcting the calculated distance based at least in part on the calculated clock frequency offset.

What is claimed is:

1. A method implemented by a first device, the method comprising:
    synchronizing a first signal generated from a signal generator with a local clock of the first device at a first time, the first signal having a first frequency;
    sending the first signal to a second device;
    synchronizing a second signal generated from the signal generator with the local clock of the first device at a second time, the second signal having a second frequency different from the first frequency, and a difference between the second time and the first time being within a predetermined range of a predetermined time difference; and
    sending the second signal to the second device;
    synchronizing a third signal and a fourth signal generated from the signal generator with the local clock at a third time and a fourth time respectively, the third signal having a third frequency and the fourth signal having a fourth frequency; and
    sending the third signal and the fourth signal to the second device, wherein sending the first signal, the second signal, the third signal, and the fourth signal to the second device enables the second device to obtain a first estimated value for a distance between the first device and the second device based on a first phase difference between the first signal and the second signal, to obtain a second estimated value for the distance between the first device and the second device based on a second phase difference between the third signal and the fourth signal, and to obtain a final estimated value for the distance between the first device and the second device based on the first estimated value and the second estimated value.

2. The method of claim 1, further comprising sending information of the first frequency, the second frequency and the predetermined time difference to the second device.

3. The method of claim 1, wherein the signal generator comprises a fractional-N phase lock loop with a resetting circuit.

4. The method of claim 3, wherein synchronizing the first signal generated from the signal generator with the local clock of the first device at the first time comprises performing a reset on the fractional-N phase lock loop through the resetting circuit at the first time.

5. The method of claim 1, wherein synchronizing the first signal generated from the signal generator with the local clock of the first device comprises establishing a phase relationship between a phase of the first signal and the local clock.

6. One or more processor readable media storing executable instructions that, when executed by one or more processors of a first device, cause the one or more processors to perform acts comprising:
    changing a signal frequency of a signal generator to a first frequency;
    synchronizing signals generated from the signal generator with a local clock of the first device at a first time;
    receiving a first signal from a second device;
    changing the signal frequency of the signal generator to a second frequency;
    synchronizing the signals generated from the signal generator with the local clock of the first device at a second time, a difference between the second time and the first time being within a predetermined range of a predetermined time difference;
    receiving a second signal from the second device;
    obtaining a first estimated value for a distance between the first device and the second device based on a first phase difference between the first signal and the second signal;
    changing the signal frequency of the signal generator to a third frequency;
    synchronizing the signals generated from the signal generator with the local clock of the first device at a third time;
    receiving a third signal from the second device;
    changing the signal frequency of the signal generator to a fourth frequency;
    synchronizing the signals generated from the signal generator with the local clock of the first device at a fourth time;
    receiving a fourth signal from the second device;
    obtaining a second estimated value for the distance between the first device and the second device based on a second phase difference between the third signal and the fourth signal; and
    obtaining a final estimated value for the distance between the first device and the second device based on the first estimated value and the second estimated value.

7. The one or more processor readable media of claim 6, the acts further comprising receiving information of the first frequency, the second frequency and the predetermined time difference from the second device.

8. The one or more processor readable media of claim 6, wherein the signal generator comprises a fractional-N phase lock loop with a resetting circuit.

9. The one or more processor readable media of claim 8, wherein synchronizing the signals generated from the signal generator with the local clock of the first device at the first time comprises performing a reset on the fractional-N phase lock loop through the resetting circuit at the first time.

10. The one or more processor readable media of claim 6, the acts further comprising calculating the predetermined range based at least in part on a frequency of the local clock and a fractional value.

11. The one or more processor readable media of claim 6, wherein synchronizing the signals generated from the signal generator with the local clock of the first device comprises establishing a phase relationship between a phase of the signals and the local clock.

12. The one or more processor readable media of claim 6, the acts further comprising:
    calculating a clock frequency offset between the local clock of the first device and a local clock of the second device; and
    correcting the calculated distance based at least in part on the calculated clock frequency offset.

13. A system implemented by a first processor chipset, the system comprising:
    one or more processors; and
    memory storing executable instructions that, when executed by the one or more processors, cause the one or more processors to perform acts comprising:
        changing a signal frequency of a signal generator to a first frequency;
        synchronizing signals generated from the signal generator with a local clock of the processor chipset at a first time;
        receiving a first signal from a second processor chipset;
        changing the signal frequency of the signal generator to a second frequency;
        synchronizing the signals generated from the signal generator with the local clock of the first processor chipset at a second time, a difference between the second time and the first time being within a predetermined range of a predetermined time difference;

receiving a second signal from the second processor chipset;

calculating a distance between the first processor chipset and the second processor chipset based on a phase difference between the first signal and the second signal;

changing the signal frequency of the signal generator to a third frequency;

synchronizing the signals generated from the signal generator with the local clock of the first processor chipset at a third time;

receiving a third signal from the second device;

changing the signal frequency of the signal generator to a fourth frequency;

synchronizing the signals generated from the signal generator with the local clock of the first processor chipset at a fourth time;

receiving a fourth signal from the second device;

obtaining a second estimated value for the distance between the first processor chipset and the second processor chipset based on a second phase difference between the third signal and the fourth signal; and obtaining a final estimated value for the distance between the first device and the second device based on the first estimated value and the second estimated value.

14. The system of claim 13, the acts further comprising receiving information of the first frequency, the second frequency and the predetermined time difference from the second processor chipset.

15. The system of claim 13, wherein the signal generator comprises a fractional-N phase lock loop with a resetting circuit.

16. The system of claim 15, wherein synchronizing the signals generated from the signal generator with the local clock of the first processor chipset at the first time comprises performing a reset on the fractional-N phase lock loop through the resetting circuit at the first time.

17. The system of claim 13, the acts further comprising:

calculating a clock frequency offset between the local clock of the first processor chipset and a local clock of the second processor chipset; and correcting the calculated distance based at least in part on the calculated clock frequency offset.

\* \* \* \* \*